United States Patent
Assimos, II et al.

(10) Patent No.: US 6,694,831 B2
(45) Date of Patent: Feb. 24, 2004

(54) METHOD AND SYSTEM FOR AUTOMATICALLY LOCATING A COMPONENT ON A PLANAR

(75) Inventors: Charles Assimos, II, Cary, NC (US); Mohamad Hassan Tawil, Cary, NC (US)

(73) Assignee: International Business Machines Corporation, Armonk, NY (US)

(*) Notice: Subject to any disclaimer, the term of this patent is extended or adjusted under 35 U.S.C. 154(b) by 125 days.

(21) Appl. No.: 09/909,060

(22) Filed: Jul. 19, 2001

(65) Prior Publication Data

US 2003/0016043 A1 Jan. 23, 2003

(51) Int. Cl.[7] .................. G01M 19/00; H01R 13/66
(52) U.S. Cl. .................................. 73/865.8; 439/622
(58) Field of Search ..................... 73/865.8, 865.9; 324/752, 555, 556; 439/622; 116/202; 340/815.45, 815.73, 815.86, 635, 653, 687

(56) References Cited

U.S. PATENT DOCUMENTS

| | | | | |
|---|---|---|---|---|
| 3,634,804 A | * | 1/1972 | Mineo | .................. 337/206 |
| 4,499,649 A | | 2/1985 | Maxner | |
| 4,622,740 A | | 11/1986 | Mirley, Jr. et al. | |
| 4,699,454 A | | 10/1987 | Brubaker | |
| 5,199,087 A | | 3/1993 | Frazier | |
| 5,790,725 A | | 8/1998 | Rykowski et al. | |
| 6,062,908 A | | 5/2000 | Jones | |

* cited by examiner

*Primary Examiner*—Hezron Williams
*Assistant Examiner*—Katina Wilson
(74) *Attorney, Agent, or Firm*—Sawyer Law group

(57) ABSTRACT

A method and system for automatically locating a component connected to a planar, such as a printed circuit board, is disclosed. The method and system comprises providing at least one substantially clear latch coupled to the component, mounting a light emitting element on the planar beneath the at least one latch, and activating the light emitting element, thereby illuminating the at least one latch of the component such that the component can be readily located.

33 Claims, 4 Drawing Sheets

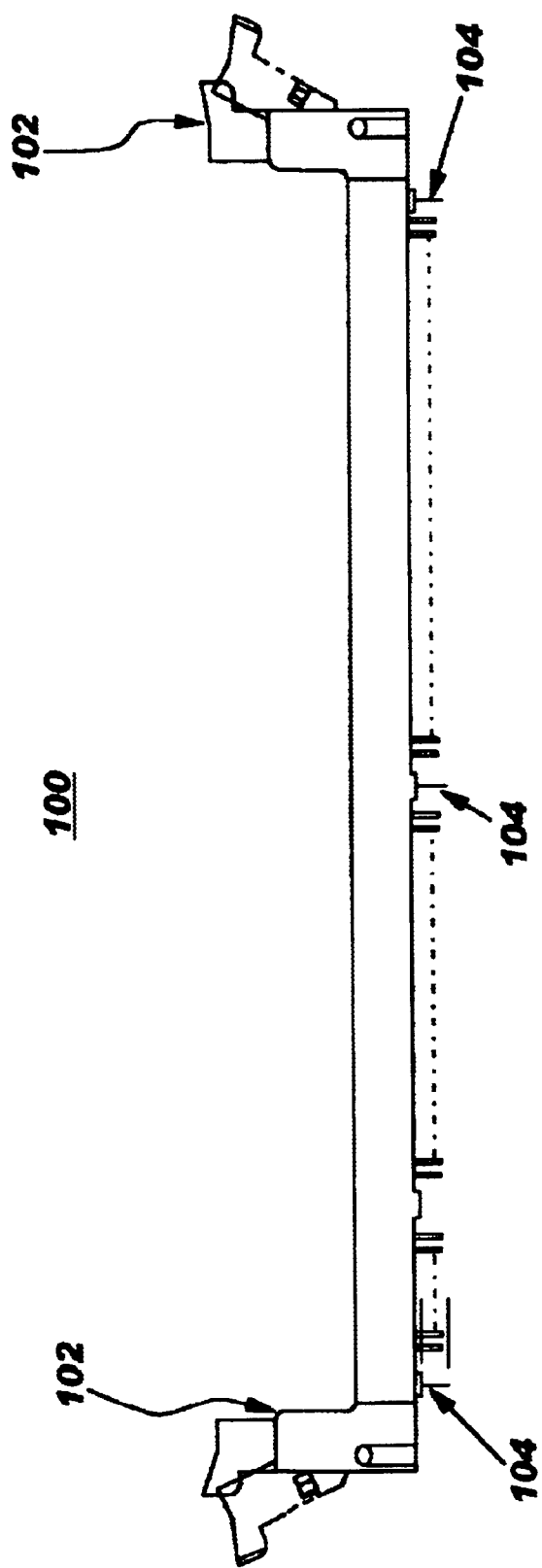

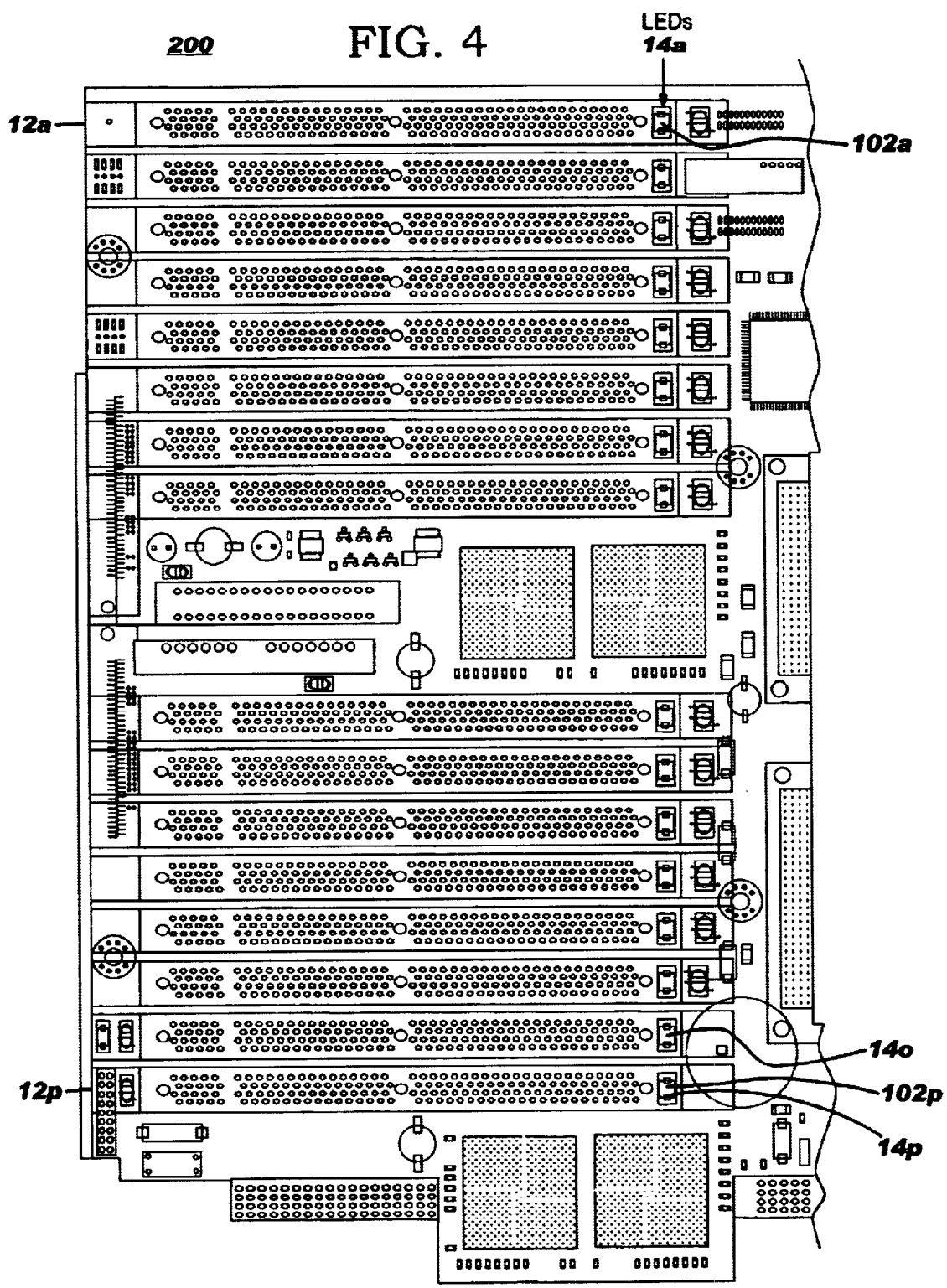

US 6,694,831 B2

METHOD AND SYSTEM FOR AUTOMATICALLY LOCATING A COMPONENT ON A PLANAR

FIELD OF THE INVENTION

The present invention relates to servicing components in computer systems and more particularly to locating a component automatically on a planar, such as a printed circuit board.

BACKGROUND OF THE INVENTION

With advances in technology, there is a continued interest in packing more components into a limited space in computer systems, such as personal computers and servers. As it is now, components can be arranged on planars, such as printed circuit boards (PCBs) to maximize the number of components, while minimizing the amount of space not utilized. FIG. 1 illustrates a portion of a typical PCB 10 with components coupled thereto. As is shown, a plurality of dual in-line memory modules (DIMMs) 12a–12p can be coupled to the PCB 10. As the number of components increases, the space on the PCB 10 becomes more impacted and it becomes more difficult to identify and locate particular components.

Diagnostic programs have been developed which audit the system for component failures. While these diagnostic programs have the ability to identify a faulty component, it is another matter altogether to locate the faulty component so that it can be serviced or replaced. The Light Path Diagnostics™ system developed by International Business Machines of Armonk, N.Y., couples a diagnostics program with a component locating element. If the program senses a nonfunctional component during an audit, an alert is issued to a system administrator, and an LED located near the nonfunctional component is illuminated. Thus, the Light Path Diagnostics™ system informs the system administrator of a failed component and indicates the location of that component on the PCB so that the administrator can replace and/or service the component.

In FIG. 1, a status LED 14a–14p, like that utilized in the Light Pat Diagnostics™ system, is placed near each component 12a–12f. Each component 12a–12f is represented by one LED 14a–14f. Therefore, if a component 12a fails, the diagnostics program (not shown) will sense the failure, notify the system administrator (not shown) of the problem, and illuminate the corresponding LED 14a near the failed component 12a. Thus, the system administrator can identify the failed component 12a by locating the illuminated corresponding LED 14a.

Although the Light Path Diagnostics™ system functions adequately for its intended purpose, difficulties arise when the number of components 12a–12p on the PCB 10 increases. For example, as more components 12 are coupled to the PCB 10, the components 12 must be placed closer together in order for all of them to fit within the confined space of the PCB 10. Accordingly, the corresponding LEDs 14 are placed closer to one another. In some circumstances, the LEDs cannot physically fit into the allotted space and must therefore be relocated. For instance, in FIG. 1, LEDs 14o and 14p cannot be located below LED 14n because of design restrictions and must be relocated to the left end of the components 12o and 12p.

As the components 12 become more densely packed, it becomes more difficult to determine which components 12 correspond to which LEDs 14. Thus, when an LED 14h is illuminated, it is difficult to determine which component is the nonfunctional component 12h corresponding to the illuminated LED 14h. If the PCB 10 is viewed from an angle other than from one directly above the illuminated LED 14h, a parallax effect can cause the administrator to incorrectly conclude that a functional component 12g corresponds to the illuminated LED 14h. Thus, the incorrect component 12g would be removed.

Accordingly, a need exists for a system and method for locating faulty components connected to a planar, such as a PCB. The system and method should be automatic and highly reliable requiring little or no maintenance. In addition, the system and method should be cost effective. The present invention addresses such a need.

SUMMARY OF THE INVENTION

A method and system for automatically locating a component on a planar, is disclosed. The method and system comprises providing at least one substantially clear latch coupled to a component, mounting a light emitting element on the planar beneath at least one latch, and activating the light emitting element, thereby illuminating the at least one latch of the component such that the component can be readily located.

Through the aspects of the present invention, the location of a faulty component on a planar is easily identified because at least one latch connected to the component is illuminated. Because the light emitting element is beneath the latch, space otherwise taken up by the LEDs is now available for additional components on the planar.

BRIEF DESCRIPTION OF THE DRAWINGS

FIG. 2 illustrates a side view of a single DIMM according to one embodiment of the present invention.

FIG. 4 illustrates a portion of the PCB in accordance with the preferred embodiment of the present invention.

DETAILED DESCRIPTION

The present invention relates to servicing components in computer systems and more particularly to automatically locating faulty components on a planar, such as a printed circuit board. The following description is presented to enable one of ordinary skill in the art to make and use the invention and is provided in the context of a patent application and its requirements. Various modifications to the preferred embodiment and the generic principles and features described herein will be readily apparent to those skilled in the art. For example, the component could be connected to some planar other than a PCB. Thus, the present invention is not intended to be limited to the embodiment shown but is to be accorded the widest scope consistent with the principles and features described herein.

The present invention is disclosed in the context of a preferred embodiment. The preferred embodiment involves identifying the location of a dual in-line memory module (DIMM) which has failed or needs servicing, where the DIMM includes at least one latch for securing the DIMM to a planar, such as a PCB 10. In conventional systems, a faulty DIMM is identified by a diagnostic program such the Light Path Diagnostics TM system. An LED 14 located near the failed DIMM is illuminated to identify the DIMM's location on the PCB 10. As stated above, this system operates adequately until the number of DIMMs increases to the point where it becomes difficult to identify which LED 14 corresponds to which DIMM.

FIG. 2 illustrates a side view of a single DIMM 100 according to the preferred embodiment of the present invention. As is shown, the DIMM 100 includes at least one latch 102 made from a substantially clear material, such as plastic. The latches 102 are located at each end of the DIMM 100 and snap into place when the DIMM 100 is installed onto the PCB 10 (not shown). Retaining pins 104 also secure the DIMM 100 to the PCB 10.

Figure 3A:
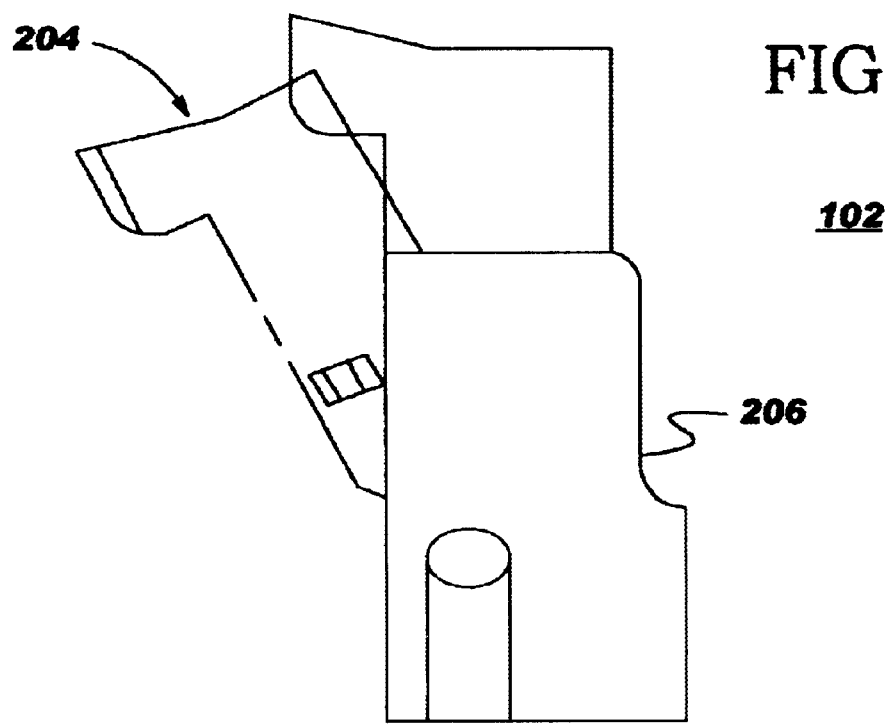
FIG. 3 illustrates orthogonal views (side and bottom) of a DIMM latch in accordance with a preferred embodiment of the present invention.
Figure 3B:
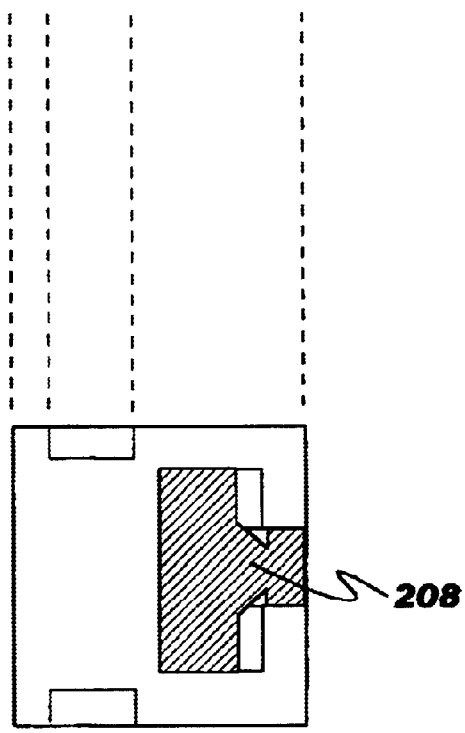

FIG. 3A illustrates a side view of the substantially clear DIMM latch 102. A handle portion 204 preferably rotates around a connector portion 206. FIG. 3B is a view from the bottom of the DIMM latch 102. As is shown, a slot 208 is formed in the bottom of the connector portion 206 so that the connector portion 206 can fit over an LED 14, or other light emitting element (not shown) when the DIMM 100 is secured to the PCB 10.

According to the present invention, the LED 14 associated with each DIMM 100 is relocated to sit directly beneath the connector portion 206 of the DIMM latch 102 on the PCB 10. When the LED 14 is activated, the DIMM latch 102 behaves like a conventional light pipe, in that it captures and diffuses the light emitted from the LED 14, i.e., the DIMM latch 102 becomes illuminated by the LED 14. This is possible because the latch 102 is made of a substantially clear material. Thus, a system administrator can easily identify the location of the faulty DIMM 100 because at least one of its latches 102 will be illuminated.

Figure 1:
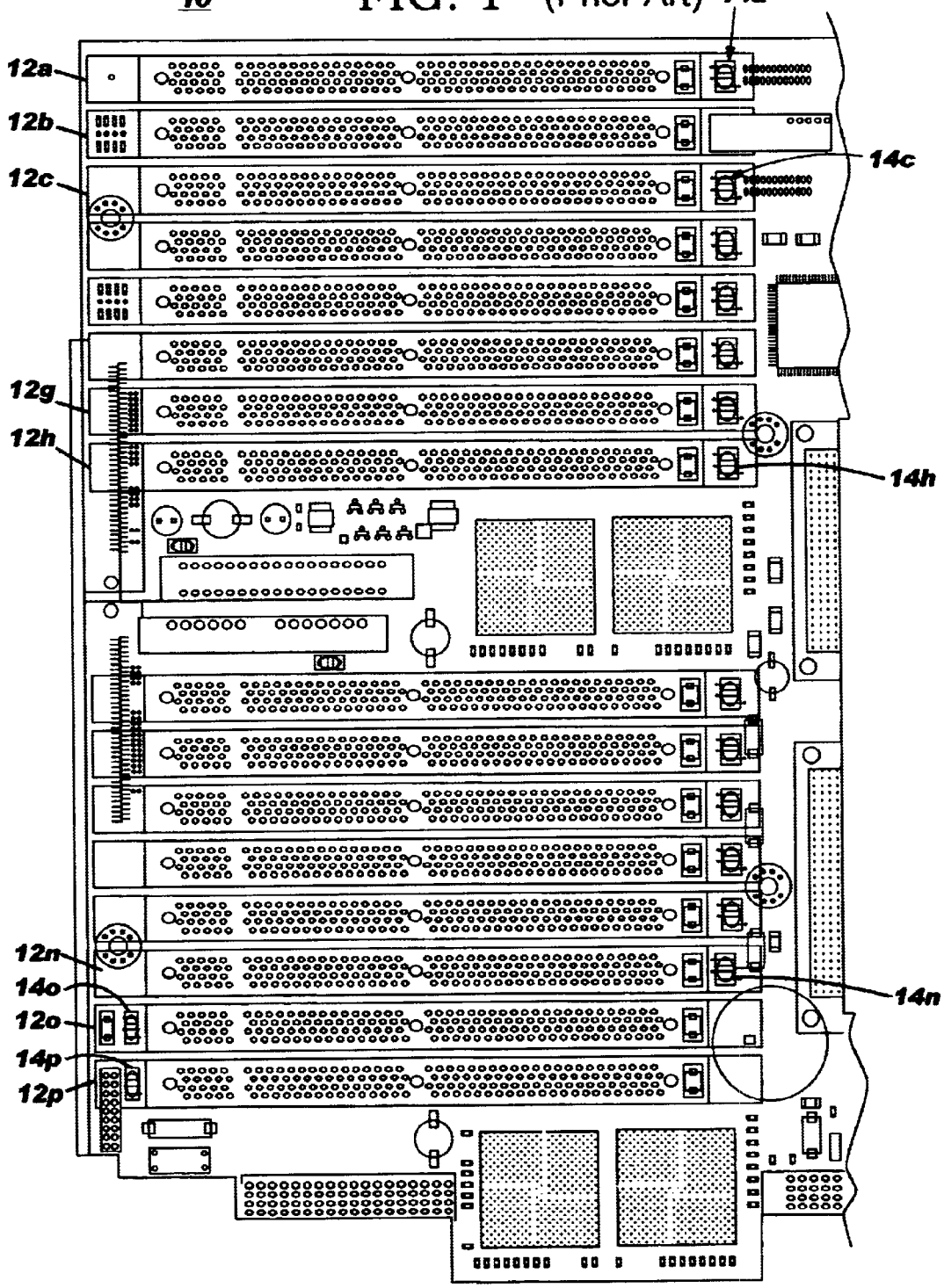
FIG. 1 illustrates a portion of a printed circuit board (PCB) with components, such as dual in-line memory modules (DIMMs), connected thereto.

FIG. 4 illustrates a portion of the PCB 200 in accordance with the preferred embodiment of the present invention. By relocating the LEDs 14—14p to sit beneath the DIMMs' 12a–12p latches 102a–102p, the space once occupied by LEDs (see FIG. 1) is now available for additional components. Note that LEDs 14o and 14p can now be located in line with the other LEDs 14a–14n. Moreover, because at least one latch 102 of the failed DIMM 100 is illuminated, there is little chance of removing the wrong DIMM 100. Finally, the present invention is cost effective because it only requires a change in the latch material. If the latch 102 is currently made of opaque plastic, it need only now be made of clear plastic. The substantially clear latch 102 of the present invention can be clear or colored, and/or the color of the LED 14 chosen depending on the preferences of the user.

Although the present invention has been described in accordance with the embodiments shown, one of ordinary skill in the art will readily recognize that there could be variations to the embodiments. For instance, although the component in the preferred embodiment is a DIMM, any component could be utilized in accordance with the present invention. In addition, while the present invention has been described as a substantially clear plastic latch 102, one of ordinary skill in the art would recognize that the latch 102 could be made from other materials, such as glass, rubber, or ceramic. The latch 102 could also be transparent or it could have color that is clear. Those exemplary variations would be within the spirit and scope of the present invention. Accordingly, many modifications may be made by one of ordinary skill in the art without departing from the spirit and scope of the appended claims.

What is claimed is:

1. A method for automatically locating a failed component connected to a planar, comprising the steps of:

(a) providing at least one substantially clear latch coupled to a component for securing the component to the planar;

(b) mounting a light emitting element on the planar beneath the at least one latch;

(c) detecting a failed component; and (d) responsive to such detection, activating the light emitting element beneath the at least one latch coupled to the failed component to illuminate, the substantially clear latch such that the location of the failed component is readily identified.

2. The method of claim 1, wherein the at least one substantially clear latch comprises a transparent latch.

3. The method of claim 1, wherein the at least one substantially clear latch comprises a colored latch.

4. The method of claim 1, wherein the component comprises a dual in-line memory module.

5. The method of claim 1, wherein the at least one substantially clear latch is configured to fit above the light emitting element.

6. The method of claim 1, wherein the detecting step (c) further includes the step of:

(c1) utilizing a diagnostic program to sense a component failure; and (c2) alerting a system administrator of the component failure.

7. The method of claim 1, wherein the light emitting element is a light emitting diode (LED).

8. The method of claim 7, wherein the component has a first substantially clear latch and a second substantially clear latch and respective first and second LEDs mounted beneath the first and second substantially clear latches.

9. The method of claim 8, wherein upon sensing a component failure, either the first or second LED associated with the failed component is illuminated.

10. The method of claim 8, wherein upon sensing a component failure, both the first and second LEDs associated with the failed component are illuminated.

11. The method of claim 1, wherein the planar is a printed circuit board.

12. The system of claim 11, wherein the planar is a printed circuit board.

13. A system for identifying a failed component connected to a planar, comprising:

means for detecting a failed component;

at least one substantially clear latch coupled to a component, the at least one substantially clear latch for securing the component to the planar;

a light emitting element mounted on the planar beneath the at least one latch; and means for activating the light emitting element, wherein when a failed component is detected, the light emitting element beneath the at least one latch of the failed component is activated, thereby illuminating the at least one latch of the failed component.

14. The system of claim 13, wherein the at least one substantially clear latch comprises a clear latch.

15. The system of claim 13, wherein the at least one substantially clear latch comprises a colored latch.

16. The system of claim 13, the component comprises a dual in-line memory module.

17. The system of claim 13, wherein the at least one substantially clear latch is configured to fit over the light emitting element.

18. The system of claim 13, further including:

means for alerting a system administrator of the component failure.

19. The system of claim 13, wherein the light emitting element is a light emitting diode (LED).

20. The system of claim 19, wherein the component has a first substantially clear latch and a second substantially clear latch and respective first and second LEDs mounted beneath the first and second substantially clear latches.

21. The system of claim 20, wherein upon sensing a component failure, the system further includes a means for illuminating either the first or second LED associated with the failed component.

22. The system of claim 20, wherein upon sensing a component failure, the system further includes means for illuminating both the first and second LEDs associated with the failed component.

23. A failure identification system for a planar comprising:
   a diagnostic program for detecting a failed component;
   a dual in-line memory module (DIMM); and
   at least one substantially clear latch coupled to the DIMM for securing the DIMM to the planar, the at least one substantially clear latch further including a handle portion coupled to a connector portion, the connector portion being adapted to accommodate a light emitting element mounted on the planar beneath the connector portion, whereby when the diagnostic program detects a failed DIMM, it activates the light emitting element beneath the connector portion associated with the at least one substantially clear latch coupled to the failed DIMM.

24. The system of claim 23, wherein the handle portion is rotatably coupled to the connector portion.

25. The system of claim 23, wherein a first substantially clear latch and a second substantially clear latch are coupled to opposing ends of the module.

26. The system of claim 23, wherein the connector portion is adapted to fit over the light emitting element.

27. The system of claim 26, wherein an opening is provided on a bottom surface of the connector portion to accommodate the light emitting element.

28. A method for automatically locating a failed component connected to a planar, comprising the steps of:
   (a) providing at least one substantially clear latch coupled to a component for securing the component to the planar, wherein the at least one substantially clear latch comprises a colored latch;
   (b) mounting a light emitting element on the planar beneath the at least one latch;
   (c) detecting a failed component; and
   (d) activating the light emitting element, wherein the substantially clear latch is illuminated such that the location of the failed component is readily identified.

29. A method for automatically locating a failed component connected to a planar, comprising the steps of:
   (a) providing a first substantially clear latch and a second substantially clear latch coupled to a component for securing the component to the planar;
   (b) mounting a first light emitting element on the planar beneath the first latch and a second light emitting element on the planar beneath the second latch;
   (c) detecting a failed component; and
   (d) activating either the first or second light emitting element associated with the failed component, wherein the first or second substantially clear latch is illuminated such that the location of the failed component is readily identified.

30. A system for identifying a failed component connected to a planar, comprising:
   means for detecting a failed component;
   a least one substantially clear latch coupled to a component, wherein the at least one substantially clear latch secures the component to the planar and is a colored latch;
   a first light emitting element mounted on the planar beneath the at least one latch; and
   means for activating the light emitting element, wherein when a failed component is detected, the light emitting element beneath the at least one latch of the failed component is activated, thereby illuminating the at least one latch of the failed component.

31. A system for identifying a failed component connected to a planar, comprising:
   means for detecting a failed component;
   a first substantially clear latch and a second substantially clear latch coupled to a component, the first and second substantially clear latch for securing the component to the planar;
   a first light emitting element mounted on the planar beneath the first latch and a second light emitting element mounted on the planar beneath the second latch; and
   means for activating a light emitting element, wherein when a failed component is detected, either the first or second light emitting element is activated, thereby illuminating the first or second latch of the failed component.

32. A failure identification system for a planar comprising:
   a diagnostic program for detecting a failed component;
   a dual in-line memory module (DIMM); and
   at least one substantially clear latch coupled to the DIMM for securing the DIMM to the planar, the at least one substantially clear latch further including a handle portion rotatably coupled to a connector portion, the connector portion being adapted to accommodate a light emitting element mounted on the planar beneath the connector portion, whereby when the diagnostic program detects a failed DIMM, it activates the light emitting element beneath the connector portion associated with the at least one substantially clear latch coupled to the failed DIMM.

33. A failure identification system for a planar comprising:
   a diagnostic program for detecting a failed component;
   a dual in-line memory module (DIMM); and
   a first substantially clear latch and a second substantially clear latch coupled to opposing ends of the DIMM for securing the DIMM to the planar, each of the first and second substantially clear latches further including a handle portion rotatably coupled to a connector portion, the connector portion being adapted to accommodate a light emitting element mounted on the planar beneath the connector portion, whereby when the diagnostic program detects a failed DIMM, it activates the light emitting element beneath the connector portion associated with the first or second substantially clear latch coupled to the failed DIMM.

* * * * *